(12) United States Patent
Ono

(10) Patent No.: US 7,598,891 B2
(45) Date of Patent: Oct. 6, 2009

(54) DATA DEVELOPMENT DEVICE AND DATA DEVELOPMENT METHOD

(75) Inventor: Akihisa Ono, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 12/078,749

(22) Filed: Apr. 4, 2008

(65) Prior Publication Data

US 2008/0270429 A1 Oct. 30, 2008

(30) Foreign Application Priority Data

Apr. 27, 2007 (JP) .............................. 2007-120177

(51) Int. Cl.
*H03M 7/30* (2006.01)
*G06F 12/02* (2006.01)
*H04N 1/41* (2006.01)

(52) U.S. Cl. .................... 341/51; 382/233; 711/153

(58) Field of Classification Search .................. 341/51; 382/233; 711/143, 153, 173
See application file for complete search history.

(56) References Cited

U.S. PATENT DOCUMENTS

| 5,729,228 | A | * | 3/1998 | Franaszek et al. ............. 341/51 |
| 6,236,759 | B1 | * | 5/2001 | Horie et al. .................. 382/244 |
| 6,272,257 | B1 | * | 8/2001 | Prokop ....................... 382/246 |
| 2005/0180643 | A1 | * | 8/2005 | Okada ........................ 382/232 |
| 2006/0007237 | A1 | * | 1/2006 | Jeffrey ....................... 345/541 |

FOREIGN PATENT DOCUMENTS

| JP | 2003-092684 A |   | 3/2003 |
| JP | 2003087798 A | * | 3/2003 |
| JP | 2003092684 A | * | 3/2003 |

* cited by examiner

*Primary Examiner*—Howard Williams
(74) *Attorney, Agent, or Firm*—Foley & Lardner LLP

(57) ABSTRACT

A data development device includes an LZ77 development part expanding data by referring to a dictionary including previous development result when data same to previous data is output, a PNG inverse filter performing arithmetic operation on development result of the LZ77 development part and image data previously output and outputting the image data, and a shared memory including an internal dictionary area and a line data area, the internal dictionary area storing previous development result referred by the LZ77 development part and the line data area storing the image data which is previously output and used by the PNG inverse filter. The shared memory has capacity for the internal dictionary area and capacity for the line data area set based on analysis result analyzing input data.

18 Claims, 14 Drawing Sheets

DATA DEVELOPMENT DEVICE AND DATA DEVELOPMENT METHOD

BACKGROUND OF THE INVENTION

1. Field of the Invention

The present invention relates to a data development device and a data development method used in an optical disk reproducing device such as HD DVD, and Blu-ray disk, the device and the method developing image data compressed in PNG method.

2. Description of Related Art

PNG (Portable Network Graphics) format has recently been known as a format of new image data. This format is widely used in web, next-generation DVD or the like. The development of the PNG data is realized by performing each process of Huffman decoding, LZ77 development, and PNG inverse filter operation (see for example United States Patent Application Publication No. 2003-92684).

FIG. 12 shows a conventional LZ77 development device. The LZ77 development device 700 includes an LZ77 development part 701, a DMA 702, an internal dictionary memory 703, and a DMA 704. Huffman decode result is input to the LZ77 development part 701. The LZ77 development part 701 stores previous decode result in a memory as a dictionary and expands data by referring to the dictionary when the data that is same to the previous data is output. Therefore, the LZ77 development device needs to have the memory corresponding to the dictionary.

In addition, the dictionary has capacity of up to 32 KB. In an application of LSI or the like, it is not practical to embed all the memory for dictionary in the LSI in cost aspect. Then, there is provided a technique for storing a part of the dictionary memory in the LSI internal dictionary memory 703 and the rest in an external dictionary area 711 of an external memory 710 as shown in FIG. 12. According to the technique, it is possible to reduce cost of the LSI with minimum performance degradation.

The DMA 702 reads out data when the LZ77 development part 701 refers to the external dictionary. The DMA 704 writes (flashes) the part or all of the data written in the internal dictionary memory 703 into the external dictionary area 711.

FIG. 13 shows a conventional PNG inverse filter arithmetic device. The PNG inverse filter arithmetic device 800 includes a PNG inverse filter 801, a line memory 802, and a DMA 803. The PNG inverse filter 801 performs arithmetic operation between the image data for one line that is previously output and the LZ77 development result. Therefore, the PNG inverse filter arithmetic device 800 needs to have line memory 802 storing data for one line that is previously output. In the application such as LSI or the like, it may be possible to store the data for one line that is previously output on the external memory 810 in cost aspect. However, it is desirable to store the data for one line that is previously output on the embedded memory of the LSI from an aspect of process performance as shown in FIG. 13. Note that the PNG inverse filter arithmetic processing result is stored in the image data output area 811 of the external memory 810 as the image data.

Based on such a background, it is preferable that the PNG development device includes the part of the dictionary memory for LZ77 (hereinafter referred to as internal dictionary) and the line memory for PNG inverse filter operation (hereinafter referred to as line memory) in order to achieve high process performance.

FIG. 14 shows a conventional PNG data development device. The PNG data development device 900 includes an LZ77 development part 901, a DMA 902, an internal dictionary memory 903, a DMA 904, an inverse PNG filter 905, a DMA 906, and a line memory 907. The PNG data development device 900 is connected to an external memory 910 including an external dictionary area 911 and an image data output area 912. As stated above, the PNG data development device 900 includes the internal dictionary memory 903 storing the LZ77 development result as a dictionary and the line memory 907 storing the image data that is previously output. The data that cannot be stored in the internal dictionary memory 903 is written into the external dictionary area 911 by the DMA 904. The LZ77 development part 901 accesses the external dictionary area 911 or the internal dictionary memory 903 to refer to the previous development result. The PNG inverse filter 905 reads out the image data that is previously output from the line memory 907 and performs inverse PNG filter processing on the data and the development result of the LZ77 development part 901 to generate the image data.

However, we have now been discovered that there are caused several problems when the PNG data development device includes the part of the memory for LZ77 dictionary as the internal dictionary and the line memory for PNG inverse filter operation. First, there is unused space in the memory for PNG inverse filter operation. This is caused because the data amount for one line varies for each image whereas the memory capacity is fixed.

Second, the process performance is degraded. This is because it is needed to access the external memory when the data is not stored in the internal dictionary in referring to the dictionary since only the part of the memory for LZ77 dictionary is stored as the internal dictionary.

SUMMARY

In one embodiment includes a development part expanding data by referring to a dictionary including previous development result when data same to previous data is output, an operation part performing arithmetic operation on development result of the development part and image data previously output and outputting the image data, and a shared memory including an internal dictionary area and a line data area, the internal dictionary area storing previous development result referred by the development part and the line data area storing the image data which is previously output and used by the operation part, in which the shared memory has capacity for the internal dictionary area and capacity for the line data area set based on analysis result analyzing input data.

In another embodiment includes analyzing input data and setting an internal dictionary area and a line data area in a shared memory, developing input data by referring to an internal dictionary including previous development result stored in the internal dictionary area of the shared memory when data same to previous data is output, and performing arithmetic operation on development result and image data previously output and stored in the line data area of the shared memory and outputting the image data.

According to the present invention, the input data is analyzed and the internal dictionary area and the line data area are provided in a shared memory. Therefore, it is possible to allocate proper capacity as the area storing the line data having different size according to the input data, to prevent the unused space from being generated in the shared memory, and to make best use of the internal dictionary area.

According to the present invention, it is possible to provide the data development device and the data development method having improved development speed by making best use of the internal memory.

BRIEF DESCRIPTION OF THE DRAWINGS

The above and other objects, advantages and features of the present invention will be more apparent from the following description of certain preferred embodiments taken in conjunction with the accompanying drawing, in which.

DETAILED DESCRIPTION OF THE PREFERRED EMBODIMENTS

The invention will now be described herein with reference to illustrative embodiments. Those skilled in the art will recognize that many alternative embodiments can be accomplished using the teachings of the present invention and that the invention is not limited to the embodiments illustrated for explanatory purposes.

The specific embodiment to which the present invention is applied will now be described in detail with reference to the drawings. The present embodiment is the one where the present invention is applied to a data development device expanding PNG (Portable Network Graphics) data compressed in PNG method. In the present embodiment, development speed is improved by enlarging a capacity of an internal dictionary by using unused space in a line memory as the internal dictionary.

Figure 1:
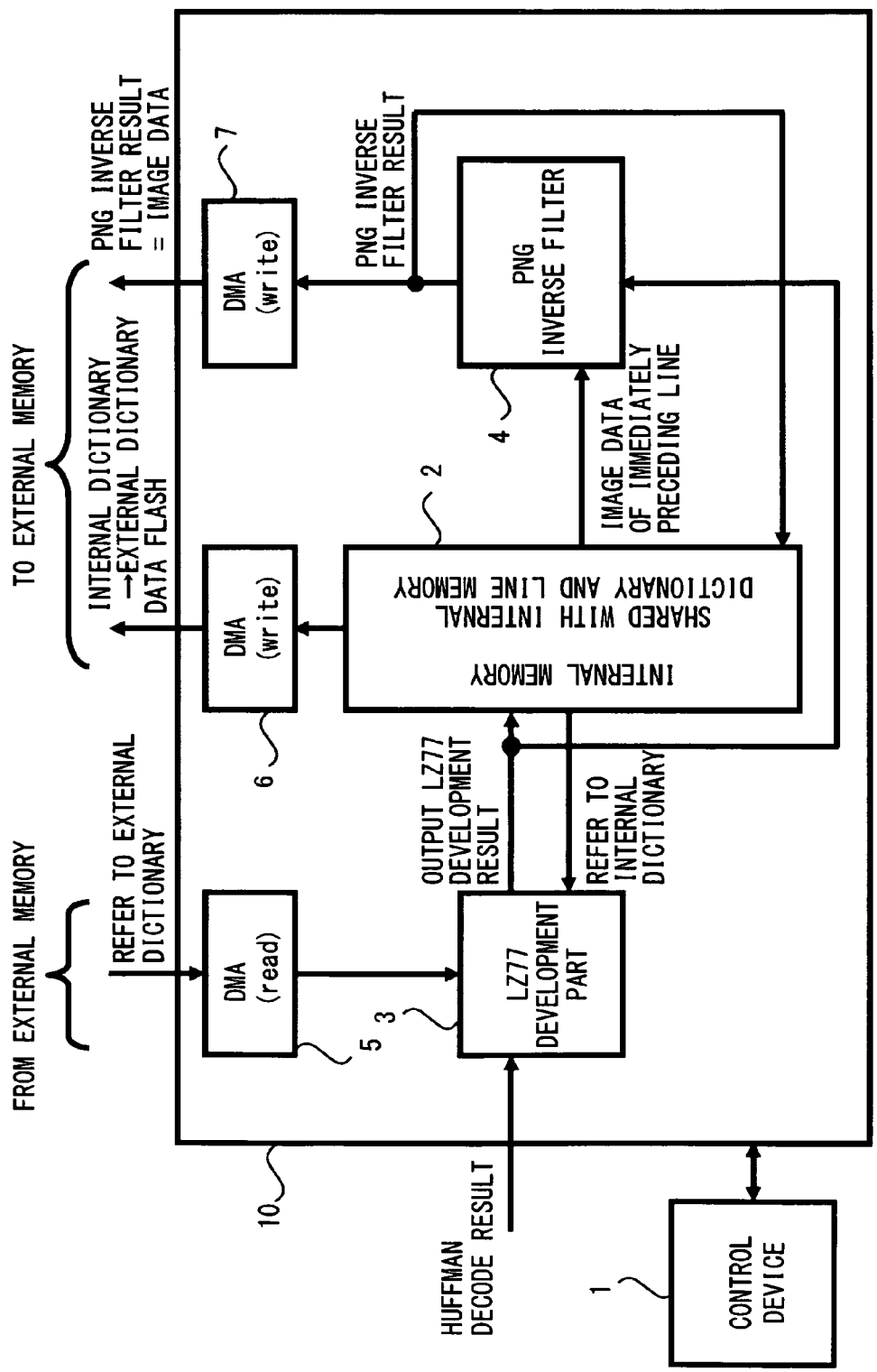
FIG. 1 is a block diagram showing a PNG data development device according to an embodiment of the present invention.

FIG. 1 is a block diagram showing a PNG data development device according to the embodiment of the present invention. A PNG data development device 10 includes an internal memory 2, an LZ77 (Lempel-Ziv 77) development part 3, a PNG inverse filter 4, and DMAs 5, 6, and 7.

The LZ77 development part 3 expands data by referring to the dictionary including previous development result when data same to previous data is output. The LZ77 development part 3 stores the previous development result in the internal memory 2.

The PNG inverse filter 4 performs arithmetic operation on the development result of the LZ77 development part 3 and the image data for one line that is previously output from the PNG inverse filter 4 to output the image data for one line. The image data for one line that is previously output from the PNG inverse filter 4 is stored in a line data area of the internal memory 2.

The internal memory 2 includes an internal dictionary area and a line data area. The LZ77 development part 3 uses the internal memory 2 as the dictionary. The PNG inverse filter 4 uses the internal memory 2 as the line memory. The capacity of the area where the LZ77 development part 3 and the PNG inverse filter 4 use the internal memory 2, which is use start position and the size are set by the control device 1 connected to the PNG data development device 10 for each image.

The DMA (Direct Memory Access) 5 is the device for bringing the data of the external memory to the internal memory 2. The DMA 5 is used by the LZ77 development part 3 in referring to the data of the external dictionary. The DMA 5 is controlled by the LZ77 development part 3 or the control device 1.

The DMA 6 and the DMA 7 write the data stored in the internal memory 2 into the external memory. The DMA 6 is controlled by the internal memory 2 or the control device 1. The DMA 7 is controlled by the PNG inverse filter 4 or the control device 1. The DMA 6 writes (flashes) the data in the internal dictionary area into the external dictionary area of the external memory as appropriate so as to prevent the internal dictionary area from being filled with data. The DMA 7 writes the image data generated by the PNG inverse filter 4 into the image output area of the external memory.

Figure 2:
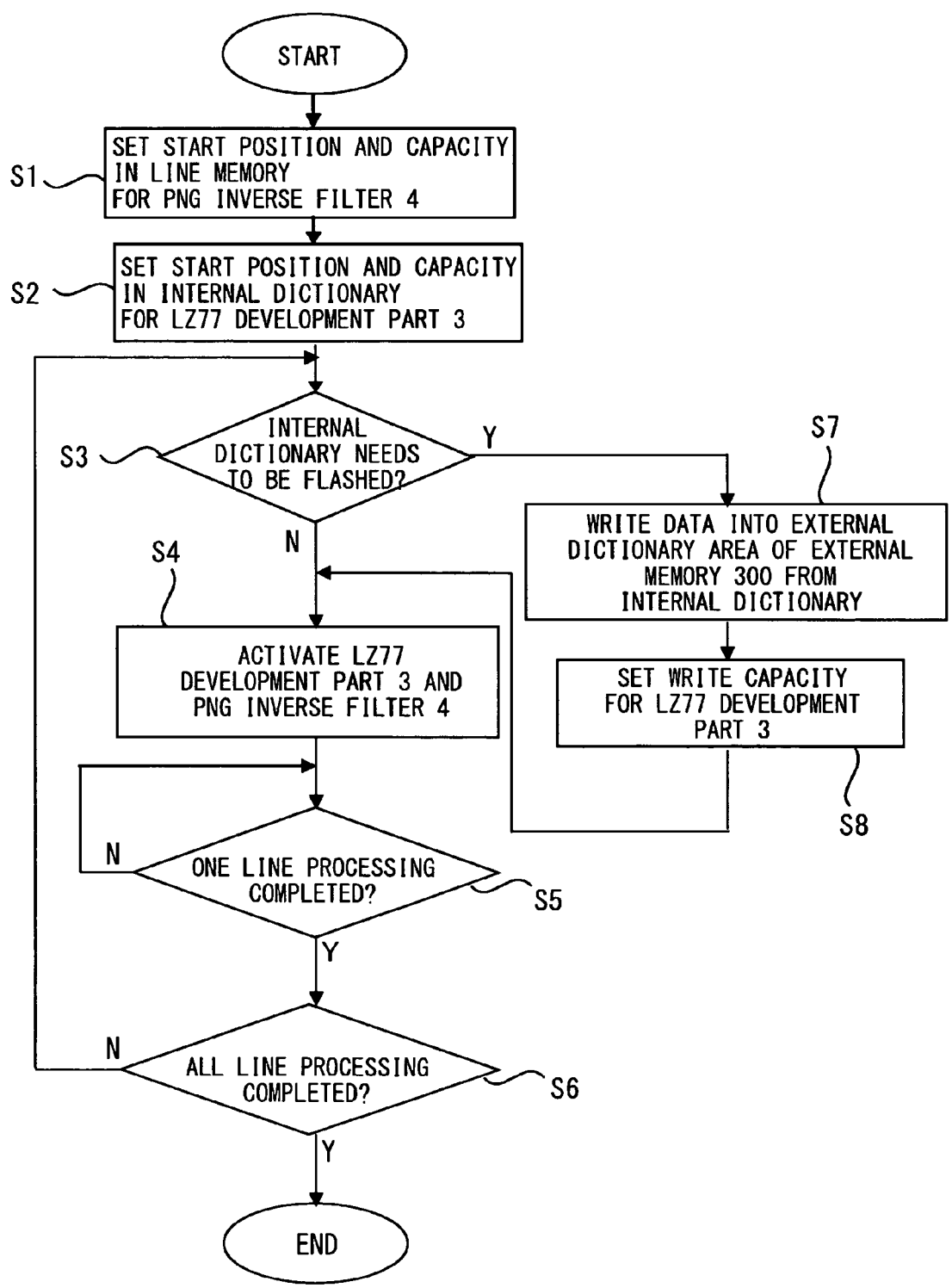
FIG. 2 is a flow chart showing a behavior of a control device in the PNG data development device according to the embodiment of the present invention.
Figure 3:
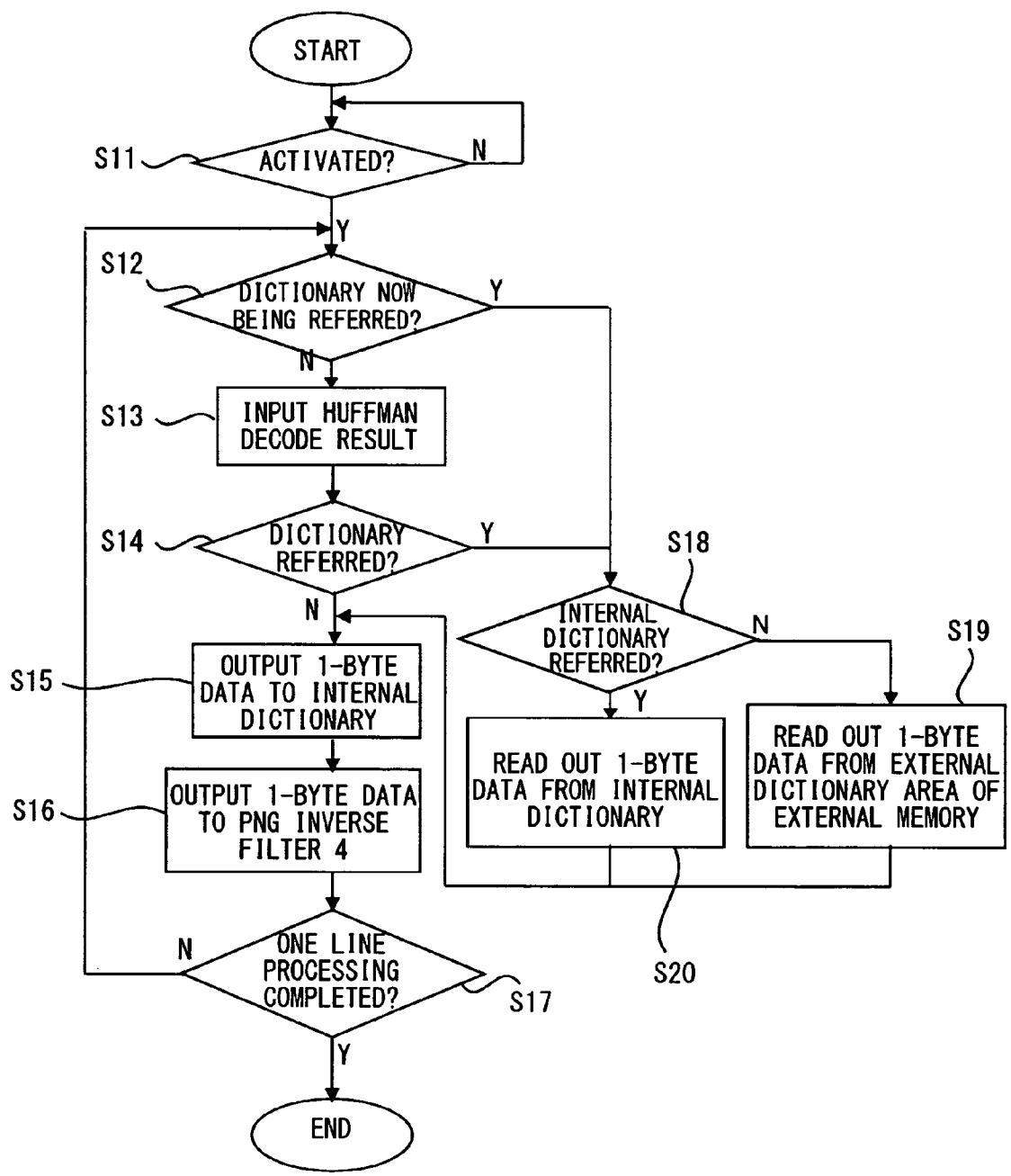
FIG. 3 is a flow chart showing a behavior of an LZ77 development part in the PNG data development device according to the embodiment of the present invention.
Figure 4:
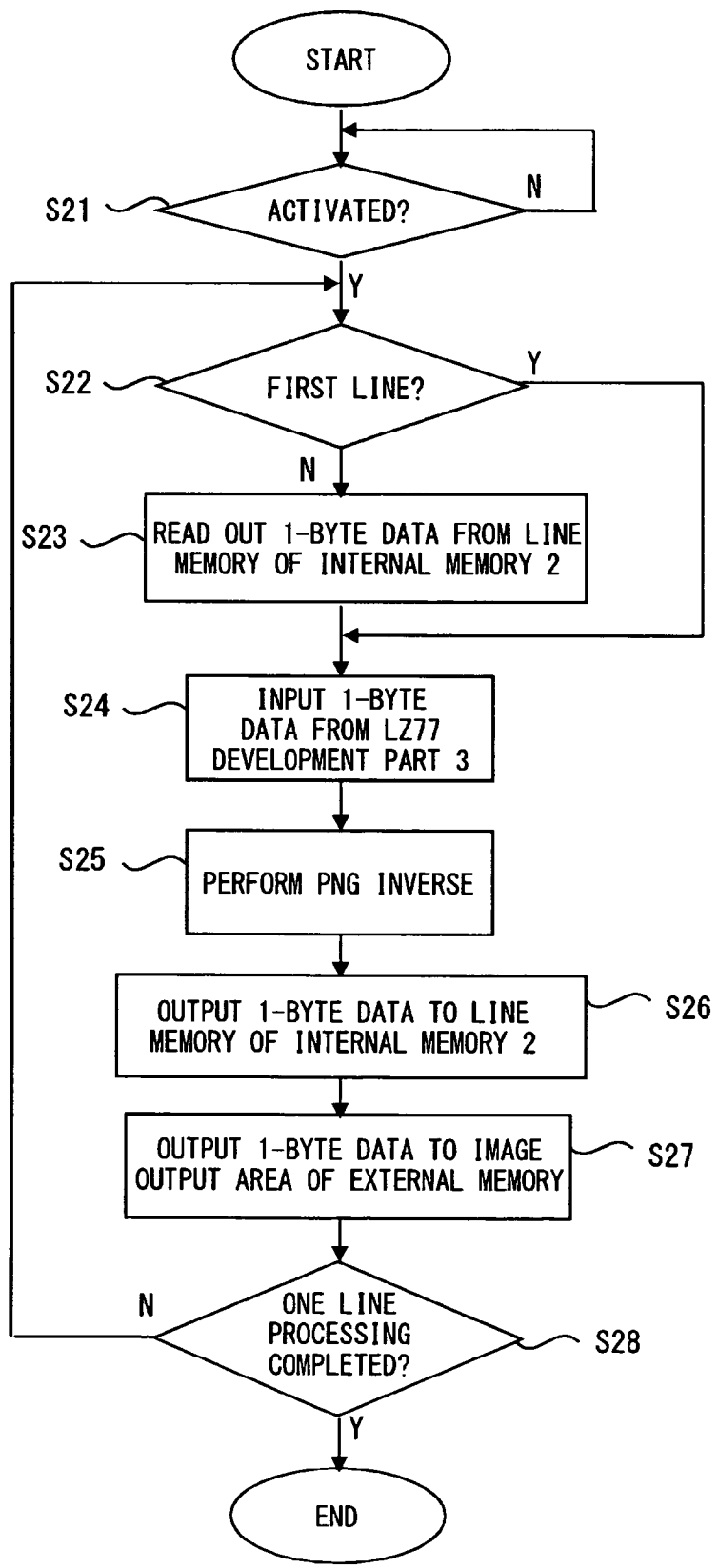
FIG. 4 is a flow chart showing a behavior of a PNG inverse filter in the PNG data development device according to the embodiment of the present invention.

Next, a behavior of the PNG data development device will be described. FIG. 2 is a flow chart showing a behavior of the control device. FIG. 3 is a flow chart showing a behavior of the LZ77 development part. FIG. 4 is a flow chart showing a behavior of the PNG inverse filter. First, the behavior of the control device 1 will be described. As shown in FIG. 2, in starting the behavior of the PNG data development device, the control device 1 analyzes the PNG data and calculates the data amount for one line. The control device 1 sets the memory area needed for the data amount for one line for the PNG inverse filter 4 (step S1). The memory area of the internal memory 2 is used by the PNG inverse filter 4 as a line memory. The memory area obtained by subtracting the data amount for one line from the total capacity of the internal memory 2 is set for the LZ77 development part 3 (step S2). The memory area of the internal memory 2 is used by the LZ77 development part 3 as the internal dictionary.

Then, it is determined whether it is required to write (flash) the internal dictionary into the external memory (step S3). When it is not required, the LZ77 development part 3 and the PNG inverse filter 4 are activated (step S4). On the other hand, when the flash of the internal dictionary is needed, the data of the internal dictionary area is written in the external dictionary area of the external memory (step S7). Then the capacity written in the external dictionary area of the external memory is set for the LZ77 development part 3 (step S8). Then the LZ77 development part 3 and the PNG inverse filter 4 are activated (step S4). When processing for one line is completed (step S5), the processing for next line is performed, and the process from step S3 will be repeated until processing for all lines is completed (step S6).

Next, the behavior of the LZ77 development part 3 will be described. The LZ77 development part 3 is activated (step S11), determines if the dictionary is now being referred (step S12), and receives Huffman decode result when the dictionary is not referred (step S13). Then it is determined if the dictionary needs to be referred to perform LZ77 development (step S14). When the dictionary needs to be referred, it is determined if there is target data in the internal dictionary (step S18). When there is target data in the internal dictionary, 1-byte data is read out from the internal dictionary area (step S20). On the other hand, when the target data is in the external dictionary area of the external memory, the LZ77 development part 3 accesses the external memory through the DMA 5 and reads out 1-byte data from the external dictionary area (step S19). When the LZ77 development is performed based on the reference result of the internal dictionary, the LZ77 development part 3 writes the development result (1-byte) to the internal dictionary area of the internal memory 2 (step S15). At the same time, the LZ77 development part 3 also outputs 1-byte data to the PNG inverse filter 4 (step S16). The process from the step S12 is repeated until processing for one line is completed (step S17).

The area of the internal dictionary of the internal memory 2 is filled with data while repeating the LZ77 development. In order to prevent this, all of or part of the data in the internal dictionary of the internal memory 2 is written into (flashes) the external dictionary area of the external memory through the DMA 6 under control of the control device 1 or the internal memory 2. As a result of this operation, the area in the internal dictionary whose data is written into the external dictionary area can be used for overwriting. Therefore, the LZ77 development part 3 can use the area as a new internal dictionary area again.

Next, the behavior of the PNG inverse filter 4 will be described. The PNG inverse filter 4 is activated (step S21), determines if current input data is a first line (step S22), and accesses the line data area of the internal memory 2 where the previous line data is stored when the input data is not the first line. Then 1-byte data is read out (step S23). At the same time, 1-byte data of the development result is received from the LZ77 development part 3 (step S24). As the data is not stored in the internal memory 2 when the input data is the first line, the PNG inverse filter 4 receives the development result from the LZ77 development part 3.

Then the PNG inverse filter operation is performed based on these data and calculates the current line data (step S25). The operation result (1-byte) is output to the line data area of the internal memory 2 (step S26) and 1-byte data is written into the image output area of the external memory through the DMA 7 (step S27). Then the process from the step S22 is repeated until the processing for one line is completed (step S28).

Note that the data amount for one line is different for each PNG image data that will be developed. Therefore, the area of the internal memory 2 is allocated for each PNG image data by the control device 1.

The present embodiment achieves two effects as follows. First, there is not generated the unused space of the memory space regardless of the image that is developed. This is because the area where the line data is stored can be set for each image data so that this area corresponds to the data amount for one line and the rest of the area is allocated as the internal dictionary area by varying the top position and the size of the memory area that is used by the LZ77 development part 3 and the PNG inverse filter 4 and having the memory space on the internal memory 2 which is the shared memory.

The second effect is that the PNG data development performance can be improved. This is because the probability of referring to the internal dictionary is increased in LZ77 development and the performance degradation due to the memory latency in referring to the external dictionary can be reduced. More specifically, when the image having small data amount for one line is treated, the area allocated to the line data area can be small. As a result, it is possible to increase the internal dictionary area and to increase the probability of referring to the internal dictionary. In general, there is a memory bus or the like interposed between the device and the external memory. Therefore, in referring to the dictionary in the external memory, large latency is added in transmitting data and the performance is degraded compared with the case where the internal dictionary is referred.

Figure 5:
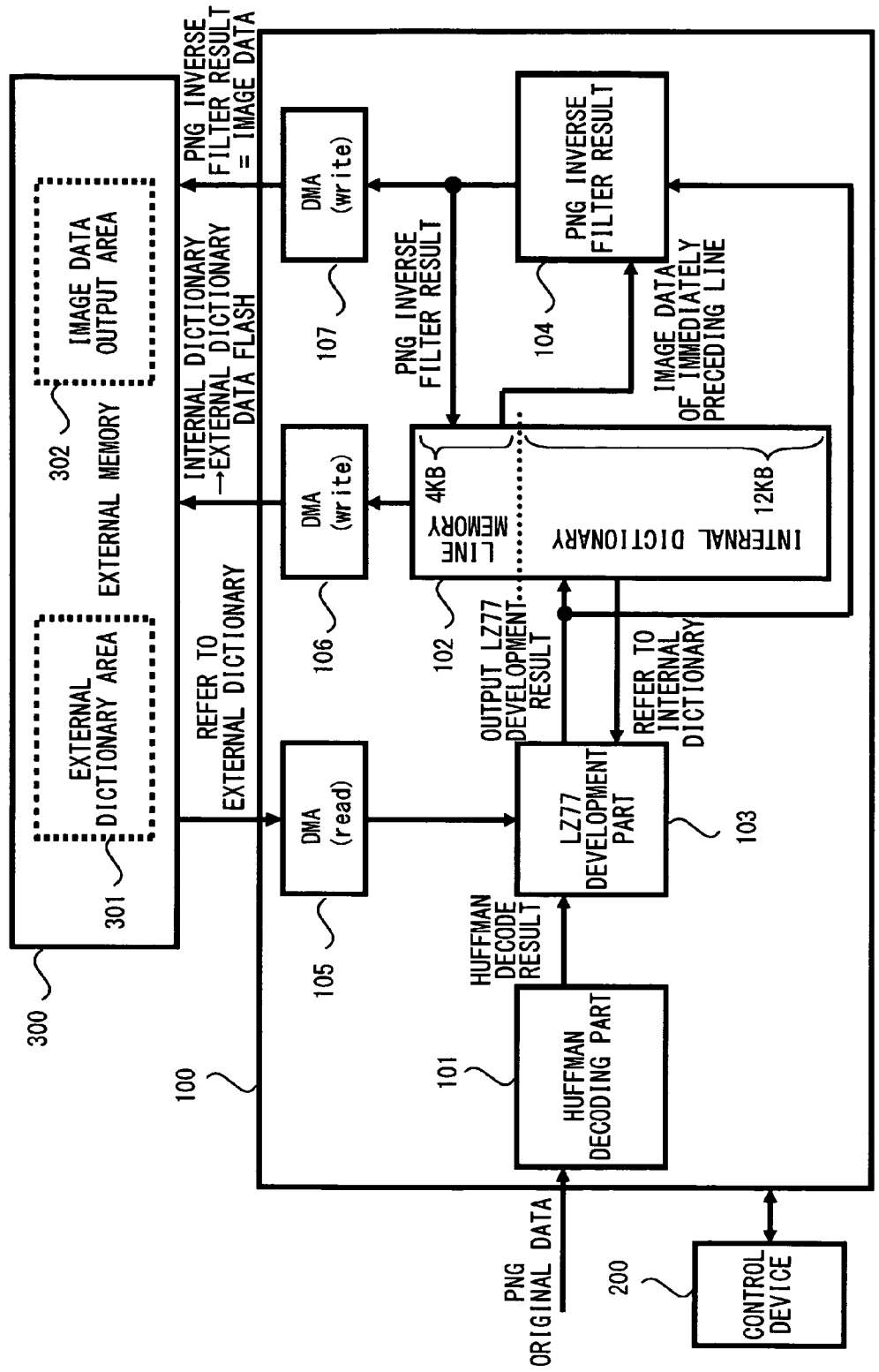
FIG. 5 is a diagram showing the PNG data development device according to the specific embodiment of the present invention.

Now, the specific example of the embodiment will be described. FIG. 5 is a diagram showing a PNG data development device 100 according to the specific example of the present embodiment. The PMG data development device 100 is connected to a control device and an external memory 300.

The PNG data development device 100 reads out PNG original data and includes a Huffman decoding part 101 performing Huffman decoding, an internal memory 102, an LZ77 development part 103, a PNG inverse filter 104, and DMAs 105 to 107. The DMA 105 reads out the dictionary from the external dictionary area 301 of the external memory 300, the DMA 106 flashes the internal dictionary into the external dictionary area 301, and the DMA 107 writes the image data generated by the PNG inverse filter 104 to the image data output area 302. The memory capacity of the internal memory 102 is 16 KB, for example.

Next, the behavior of the PNG data development device according to the present embodiment will be described. FIGS. 6 to 9 show the internal memory while the PNG data development device performs data development. In this embodiment, we consider a case where the data amount for one line develops the image of 4 KB. The control device 200 analyzes the PNG image that is to be developed and recognizes that the capacity of one line is 4 KB. This can be determined by relatively simple analysis according to the PNG standard without actually performing development of PNG data.

Then, the control device 200 instructs the PNG inverse filter 104 to use the memory area where start position is 0 and capacity is 4 KB as the line data area. The control device 200 further instructs the LZ77 development part 103 to use the memory area where start position is 4 KB and capacity is 12 KB as the internal dictionary.

The control device 200 starts the operation of the Huffman decoding part 101, the LZ77 development part 103, and the PNG inverse filter 104 in order to develop the first line. The Huffman decoding part 101 reads out the PNG original data and outputs the Huffman decode result to the LZ77 development part 103. The LZ77 development part 103 receives the Huffman decode result, performs LZ77 development, and writes the result to the internal dictionary area of the internal memory 102. When it is needed to look up the dictionary in performing LZ77 development, the data in the dictionary is read out as appropriate from the internal dictionary area and proceeds development operation. The PNG inverse filter 104 inputs the LZ77 development result of the first line from the LZ77 development part 103 to perform PNG inverse filter operation of the first line.

The operation result is written into the image data output area 302 of the external memory 300 through the DMA 107. The same data is written into the line data area of the internal memory 102.

Figure 6:
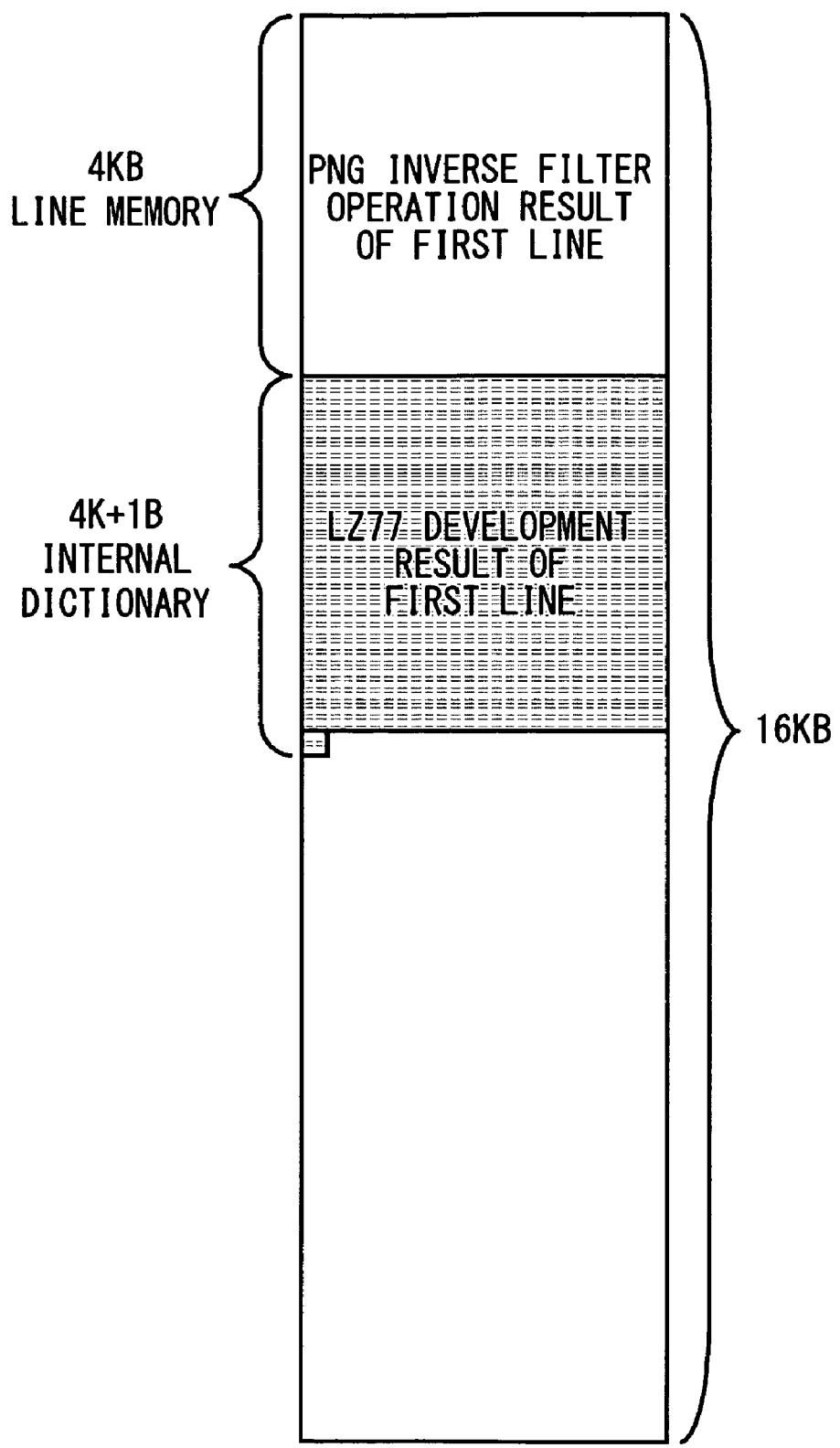
FIG. 6 is a diagram showing an aspect of an internal memory when the PNG data development device performs data development.

After performing the PNG inverse filter operation of the first line by the LZ77 development part 103 and the PNG inverse filter 104, the internal memory 102 is as shown in FIG. 6. The 4 KB data which is equal to the first line of the image data (PNG inverse filter operation result of the first line) is written in the line data area, and 4K+1B data (LZ77 development result of the first line) is written in the internal dictionary area. The data capacity in the internal dictionary area can be described according to the PNG standard as data amount for one line plus 1-byte. The 4 KB data is written as the first line of the image data (PNG inverse filter operation result of the first line) in the image data output area of the external memory 300.

Next, the control device 200 starts the operation of the Huffman decoding part 101, the LZ77 development part 103, and the PNG inverse filter 104 in order to develop the second line. The LZ77 development part 103 writes the LZ77 development result into the internal dictionary of the internal memory 102 from continuation part after the first line is processed. This is because there is a need to leave the result after the first line is processed since the previous area of 32 KB may be referred as the dictionary. When there is a need to look up the dictionary, the data of the dictionary is read out from the internal dictionary to proceed the development process as in the first line.

The PNG inverse filter 104 receives the LZ77 development result of the second line from the LZ77 development part 103 and further reads out the data of the first line from the line data area of the internal memory 102 in order to perform the PNG inverse filter operation of the second line. The PNG inverse filter 104 performs PNG inverse filter operation from the two data.

The operation result is written into the image output area of the external memory 300 through the DMA 107. The same data is written into the line data area of the internal memory 102. When the data is written into the line data area of the internal memory 102, the data can be overwritten into the data of the first line. This is because the overwritten data has already been read out from the PNG inverse filter 104 and has been used in the PNG inverse filter processing.

Figure 7:
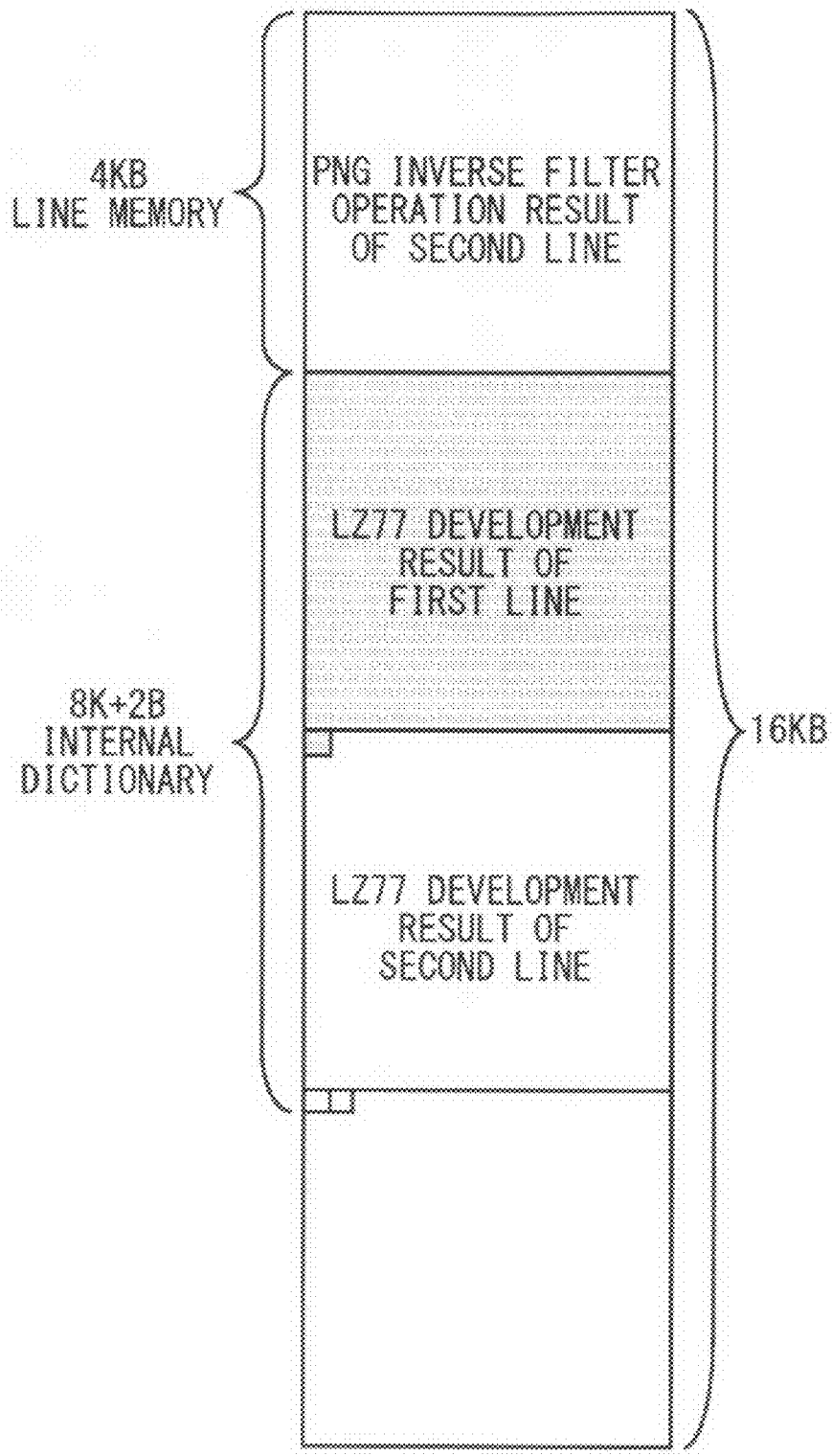
FIG. 7 is a diagram showing an aspect of the internal memory when the PNG data development device performs data development.

After the LZ77 development part 103 and the PNG inverse filter 104 perform PNG inverse filter operation of the second line, the data in the internal memory 102 is as in FIG. 7. The 4 KB data equal to the second line of the image (PNG inverse filter operation result of the second line) is written into the line data area. The 8K+2B data (the LZ77 development result of the first line and the LZ77 development result of the second line) is written into the internal dictionary area. The 4 KB data as the first line of the image (PNG inverse filter operation result of the first line) and the 4 KB data as the second line of the image (PNG inverse filter operation result of the second line) are written into the image data output area 302 of the external memory 300.

Figure 8:
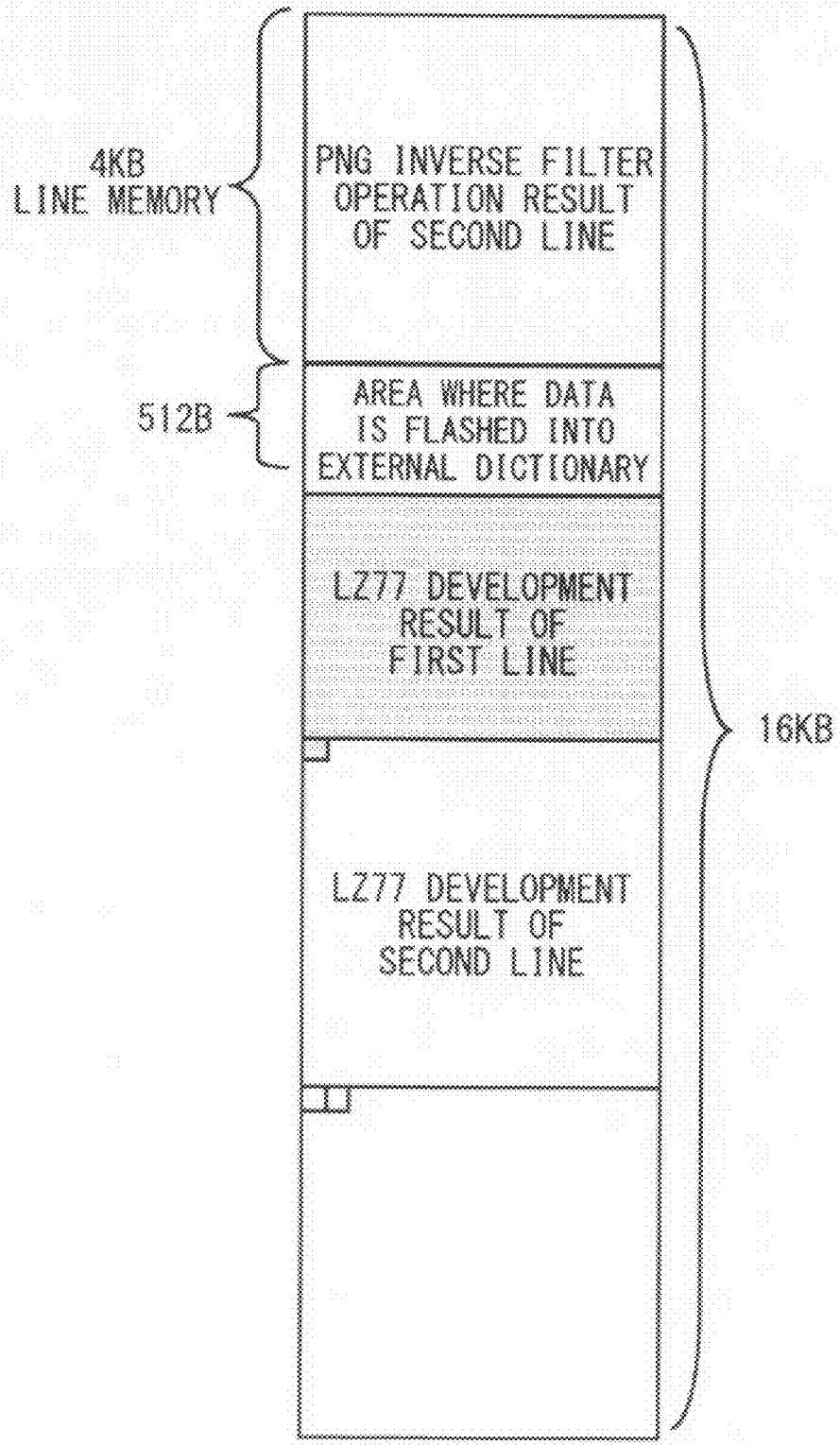
FIG. 8 is a diagram showing an aspect of the internal memory when the PNG data development device performs data development.

Next a third line is developed. However, there is no enough space left in the internal dictionary area of the internal memory 102 for developing the third line. More specifically, the space of 4K+1B is needed in the internal dictionary area in order to develop the third line. However, there is only space of 4K−2B in the internal dictionary area. Therefore, the control device 200 flashes the part of the internal dictionary into the external dictionary area 301 of the external memory 300. In the present embodiment, the 512-byte data which is written earliest among the data in the internal dictionary area is flashed. The internal memory after the flash operation is completed is as shown in FIG. 8.

As a result, the dictionary of the LZ77 is divided into the external dictionary area 301 of the external memory 300 and the internal dictionary area of the internal memory 102. Therefore, when reference is made to the dictionary in LZ77 development, the LZ77 development part 103 determines if the desired data is in the internal dictionary area or in the external dictionary area to select the dictionary that is read out. When reference is made to the internal dictionary, the process is the same to those in the first line and the second line. On the other hand, when reference is made to the external dictionary, the data is read out from the external dictionary area 301 of the external memory 300 through the DMA 105.

After the flash operation of the internal dictionary, the control device 200 starts operation of the Huffman decoding part 101, the LZ77 development part 103, and the PNG inverse filter 104 in order to develop the third line. The LZ77 development part 103 writes the LZ77 development result to the internal dictionary area of the internal memory 102 from the continuation part of the result where the second line is processed. When the LZ77 development result is written to the lower end of the internal dictionary, the LZ77 development part 103 continues writing of the data from the upper end of the internal dictionary area of the internal memory 102 as in ring buffer. The area of the upper end of the internal dictionary has already been flashed into the external dictionary area of the external memory 300 and can be used for overwriting. When there is a need to look up the dictionary, the data in the dictionary is read out as appropriate from the external dictionary area 301 or the internal dictionary area to proceed the development operation.

The PNG inverse filter 104 receives the LZ77 development result of the third line from the LZ77 development part 103 and further reads out the data of the second line from the line data area of the internal memory 102 in order to perform the PNG inverse filter operation of the third line as in the operation of the second line. Then the PNG inverse filter operation is performed from the two data.

The operation result is written into the image data output area 302 of the external memory 300 through the DMA 107 as in the operation of the second line. The same data is written into the line data area of the internal memory 102. When data is written into the line data area of the internal memory 102, the data can be overwritten into the data of the second line. This is because the overwritten data has already been read out from the PNG inverse filter 104 and has been used in the PNG inverse filter processing.

Figure 9:
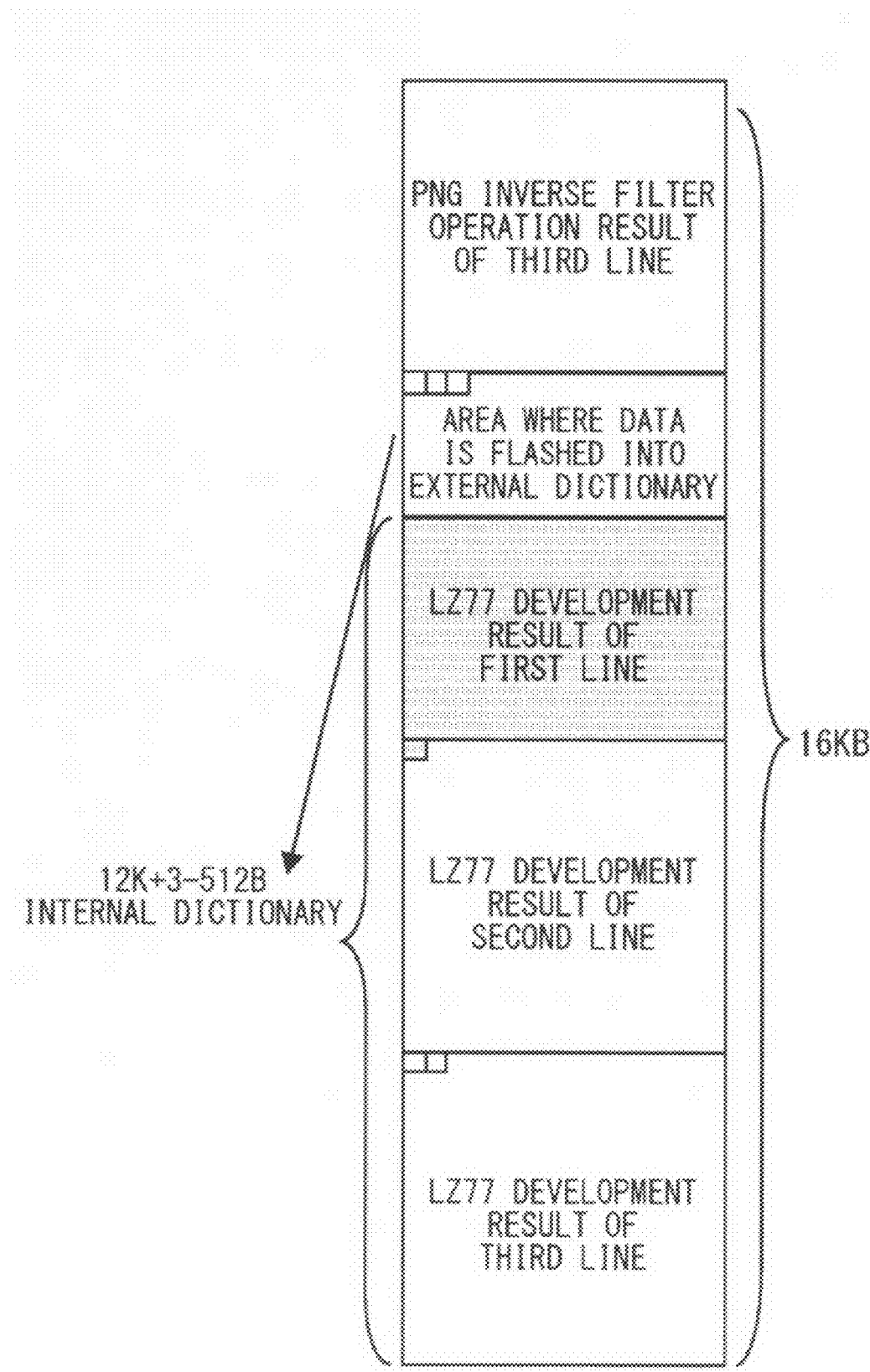
FIG. 9 is a diagram showing an aspect of the internal memory when the PNG data development device performs data development.

After the LZ77 development part 103 and the PNG inverse filter 104 perform PNG inverse filter operation of the third line, the data in the internal memory 102 is as in FIG. 9. The 4 KB data corresponding to the third line of the image (the PNG inverse filter operation result of the third line) is written in the line data area, and 12K+3−512B data (a part of the LZ77 development result of the first line, the LZ77 development result of the second line, and the LZ77 development result of the third line) is written in the internal dictionary area. Note that 512 B is the capacity that is flashed into the external dictionary area 301 before the development of the third line is started. The 4 KB data is written as the first line of the image (PNG inverse filter operation result of the first line), the 4 KB data is written as the second line (PNG inverse filter operation result of the second line), and the 4 KB data as the third line (PNG inverse filter operation result of the third line) is written in the image data output area 302 of the external memory 300. The 512 B data is written in the external dictionary area 301 of the external memory 300. Hereinafter, the processing is continued until all the line of the PNG data is developed.

In the embodiment, the PNG data development device 100 includes the internal memory, the LZ77 development part 103, and the PNG inverse filter 104. The internal memory includes the internal dictionary area and the line data area. The LZ77 development part 103 can change the capacity and the start position of the internal dictionary area for each image. The PNG inverse filter 104 can change the capacity and the start position of the line data area for each image. Further, the PNG data development device 100 is connected to the control device 200 setting the start position and the capacity of the internal dictionary area and the start position and the capacity of the line data area for each image for the LZ77 development part 103 and the PNG inverse filter 104.

Therefore, in starting development of the PNG data by the PNG data development device 100, the control device 200 analyzes the PNG data and calculates the data amount for one line of the output image. The control device 200 sets the start position and the capacity of the line data area of the PNG inverse filter 104 so that the internal memory 102 can be effectively used in the line data area based on the data amount for one line. Further, the control device 200 sets the internal dictionary start position and the capacity of the LZ77 development part 103 to use the memory area having capacity which is obtained by subtracting the data amount for one line from the total capacity of the internal memory as the internal dictionary area. As a result, the internal memory 102 can be effectively used without the unused space and to increase the capacity of the internal dictionary area. Therefore, it is possible not to generate the unused space of the memory space and to improve the PNG data development performance regardless of the image that is to be developed.

Figure 10:
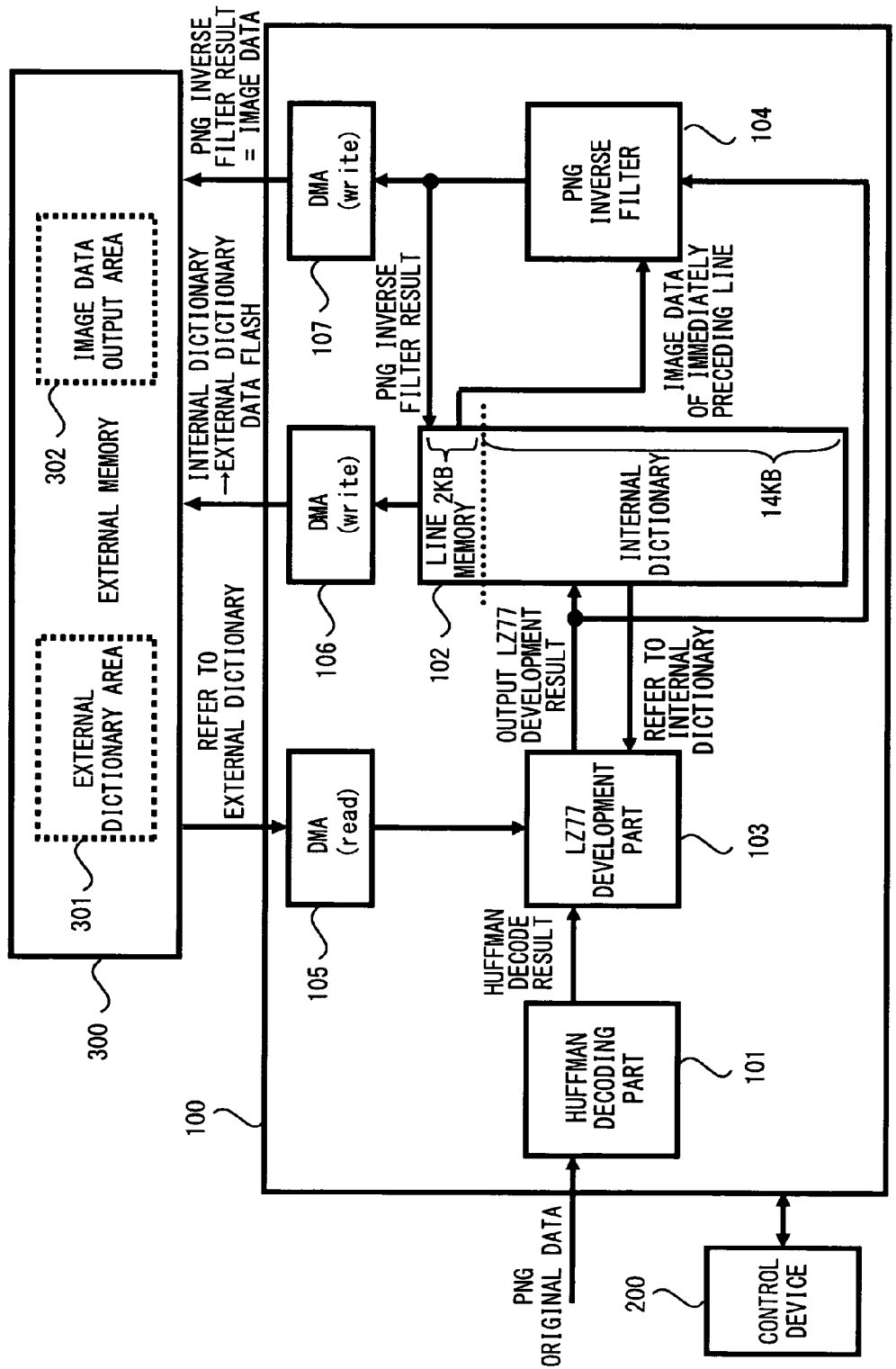
FIG. 10 is a diagram showing a variant example according to the embodiment of the present invention.

FIG. 10 shows a variant example according to the present embodiment. In the present example, the image having data amount of one line of 2 KB is developed. The control device 200 analyzes the PNG image that is to be developed and recognizes that the capacity of one line is 2 KB. Next, the control device 200 instructs the PNG inverse filter 104 to use the memory area where start position is 0 and capacity is 2 KB as the line data area. The control device 200 instructs the LZ77 development part 103 to use the memory area where start position is 2 KB and capacity is 14 KB as the internal dictionary area. The control device 200 performs the development of the PNG image on other parts as described above. Therefore, the internal dictionary area is increased compared with the case where the line data area is set to 4 KB, which means hit rate to the internal dictionary can be increased when reference is made to the dictionary for LZ77 development and the high PNG development process can be expected.

Figure 11:
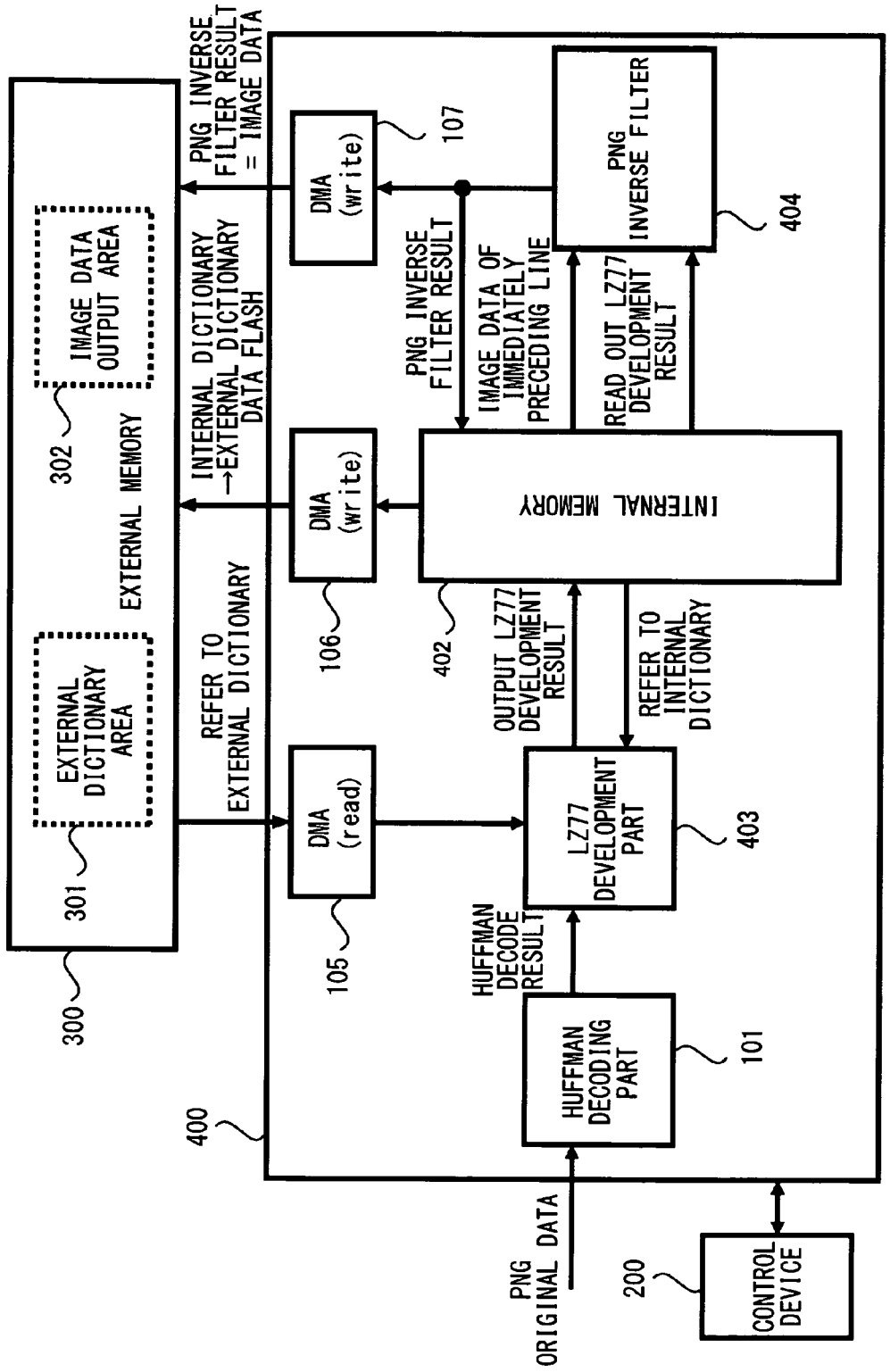
FIG. 11 is a diagram showing another variant example according to the embodiment of the present invention.
Figure 12:
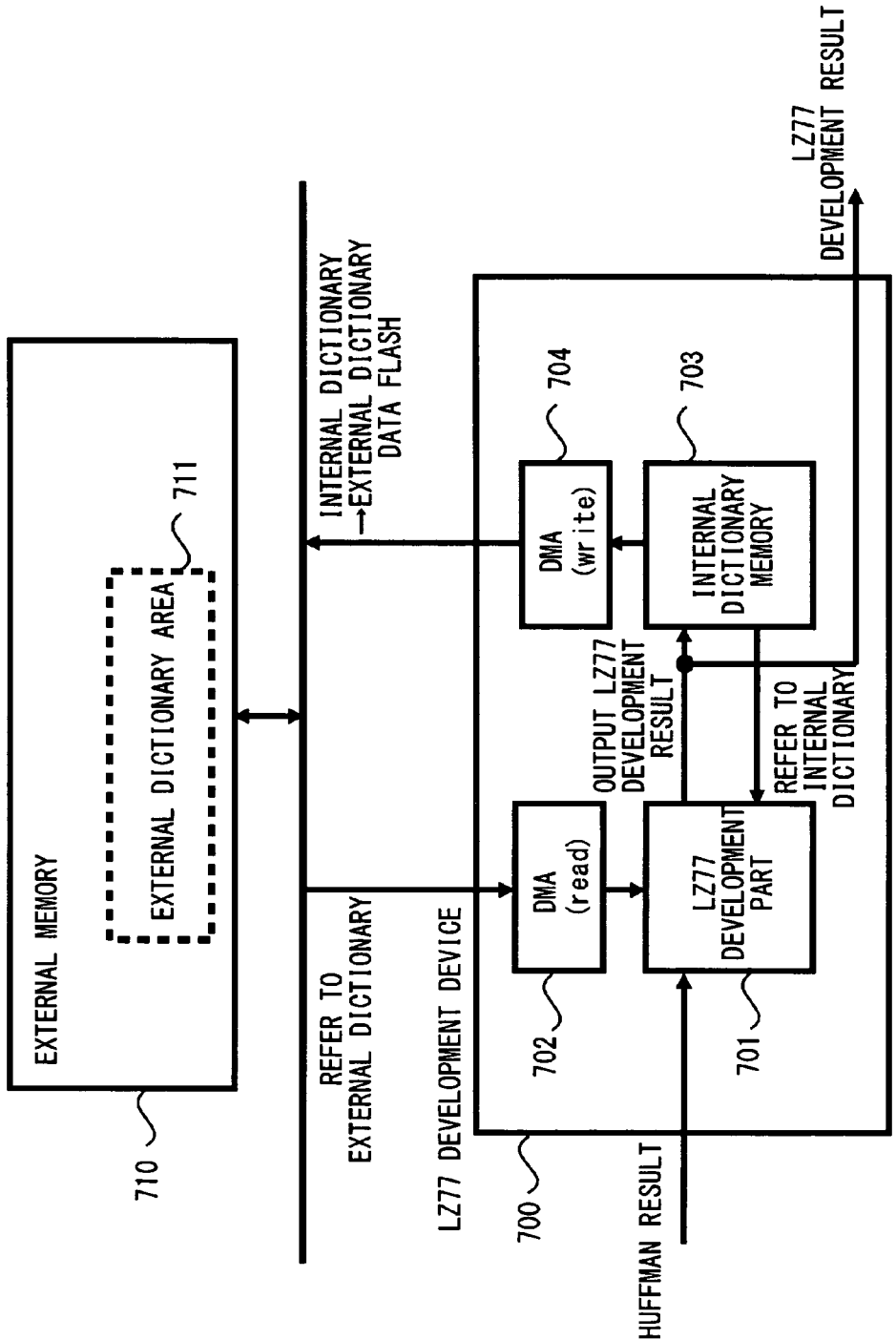
FIG. 12 is a diagram showing a conventional LZ77 development device.
Figure 13:
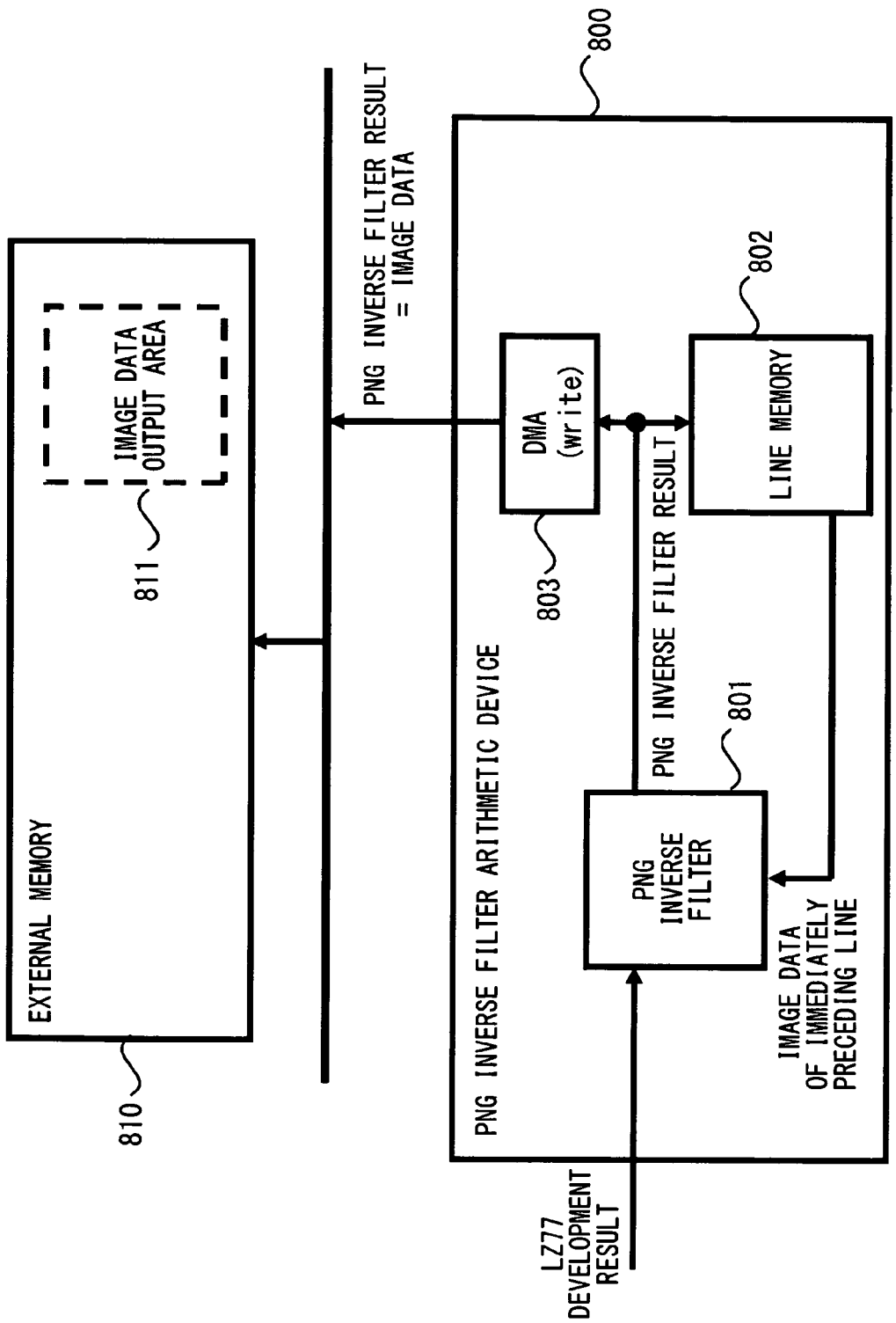
FIG. 13 is a diagram showing a conventional PNG inverse filter arithmetic device.
Figure 14:
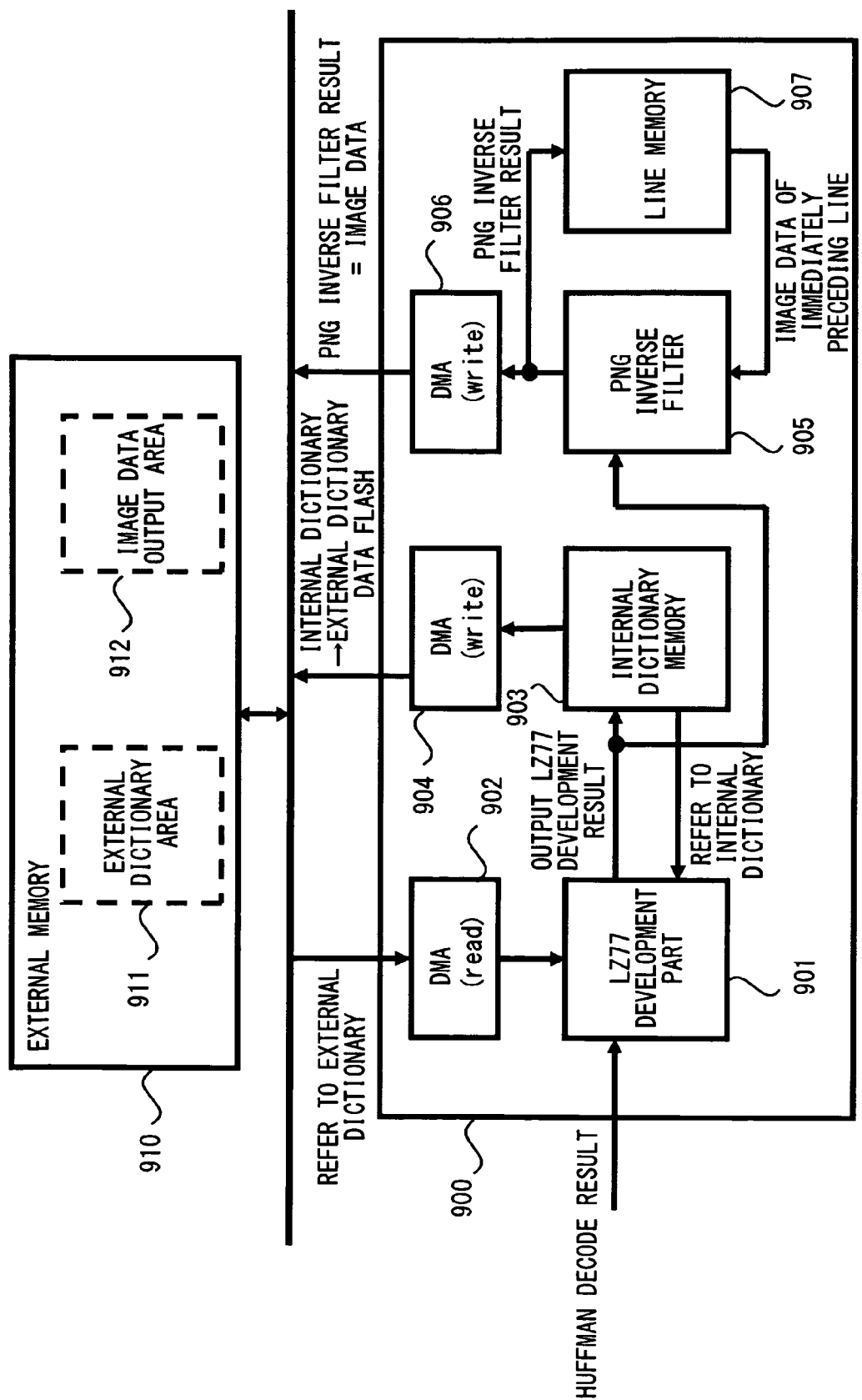
FIG. 14 is a diagram showing a conventional PNG data development device.

FIG. 11 shows another variant example according to the embodiment. In the present embodiment, the data is input to the PNG inverse filter 404 by reading the data from the internal memory 402. This technique is practical in the present example since both of the data written into the internal dictionary area by the LZ77 development part 403 and the data output to the PNG inverse filter 404 are the LZ77 development result and equal with each other. Therefore, the internal dictionary area of the internal memory 402 works as the input and output buffer between the LZ77 development part 403 and the PNG inverse filter 404. Therefore, the LZ77 development result output signal line from the LZ77 development part 403 to the PNG inverse filter 404 is omitted, and the inverse filter 404 reads out the LZ77 development result as appropriate from the internal dictionary of the internal memory 402 to perform the PNG inverse filter operation. When the PNG inverse filter 404 starts the PNG inverse filter operation, the control device 200 instructs the read start position and the capacity of the proper internal memory 402 and the operation start timing.

It is apparent that the present invention is not limited to the above embodiments, but may be modified and changed without departing from the scope and spirit of the invention.

What is claimed is:

1. A data development device comprising:
a development part expanding data by referring to a dictionary including previous development result when data same to previous data is output;
an operation part performing arithmetic operation on development result of the development part and image data previously output and outputting image data; and
a shared memory including an internal dictionary area and a line data area, the internal dictionary area storing previous development result referred by the development part and the line data area storing the image data, the image data being previously output and used by the operation part,
wherein the shared memory has capacity for the internal dictionary area and capacity for the line data area set based on analysis result analyzing input data.

2. The data development device according to claim 1, wherein the shared memory has capacity for the internal dictionary area and capacity for the line data area set for each image data.

3. The data development device according to claim 2, wherein:
the development part develops Huffman decode result, and
the shared memory has capacity for the internal dictionary area and capacity for the line data area set based on analysis result analyzing PNG data compressed in PNG method.

4. The data development device according to claim 3, wherein the operation part is a PNG inverse filter processing part performing PNG inverse filter processing on the LZ77 development result and the image data for one line previously output and stored in the shared memory.

5. The data development device according to claim 3, wherein:
the data development device is connected to an external memory including an external dictionary area where development result of the LZ77 development part is stored along with the internal dictionary area, and
the LZ77 development part refers to the external dictionary area as needed.

6. The data development device according to claim 3, wherein the LZ77 development part writes development result of the LZ77 development part into the internal dictionary area, and
the PNG inverse filter reads out the development result by accessing the internal dictionary area.

7. The data development device according to claim 2 comprising a Huffman decoding part performing Huffman decoding on PNG data,
wherein the development part is an LZ77 development part performing LZ77 development on a decode result of the Huffman decoding part.

8. The data development device according to claim 1, wherein:
the development part develops Huffman decode result, and
the shared memory has capacity for the internal dictionary area and capacity for the line data area set based on analysis result analyzing PNG data compressed in PNG method.

9. The data development device according to claim 1 comprising a Huffman decoding part performing Huffman decoding on PNG data, wherein the development part is an LZ77 development part performing LZ77 development on a decode result of the Huffman decoding part.

10. The data development device according to claim 9, wherein:
the data development device is connected to an external memory including an external dictionary area where development result of the LZ77 development part is stored along with the internal dictionary area, and
the LZ77 development part refers to the external dictionary area as needed.

11. The data development device according to claim 9, wherein the LZ77 development part writes development result of the LZ77 development part into the internal dictionary area, and
the PNG inverse filter reads out the development result by accessing the internal dictionary area.

12. A data development method comprising:
analyzing input data and setting an internal dictionary area and a line data area in a shared memory;
developing input data by referring to an internal dictionary including previous development result stored in the internal dictionary area of the shared memory when data same to previous data is output; and
performing arithmetic operation on development result and image data previously output and stored in the line data area of the shared memory and outputting image data.

13. The data development method according to claim 12, wherein capacity for the internal dictionary area and capacity for the line data area are set for each image data.

14. The data development method according to claim 13, comprising:
performing Huffman decoding on PNG data;
performing LZ77 development on the Huffman decode result by referring to the internal dictionary stored in the internal dictionary area; and
performing PNG inverse filter processing on the LZ77 development result and the image data for one line previously output and stored in the line data area to output the image data.

15. The data development method according to claim 12, comprising:
performing Huffman decoding on PNG data;
performing LZ77 development on the Huffman decode result by referring to the internal dictionary stored in the internal dictionary area; and
performing PNG inverse filter processing on the LZ77 development result and the image data for one line previously output and stored in the line data area to output the image data.

16. The data development method according to claim 15, comprising:
accessing an external memory including an external dictionary area where the LZ77 development result is stored along with the internal dictionary area as needed, and performing LZ77 development by referring to an external dictionary stored in the external dictionary area.

17. The data development method according to claim 16, comprising:
writing development result of the LZ77 into the internal dictionary area; and
accessing the internal dictionary area, reading out the development result, and performing PNG inverse filter processing.

18. The data development method according to claim 15, comprising:
writing development result of the LZ77 into the internal dictionary area; and
accessing the internal dictionary area, reading out the development result, and performing PNG inverse filter processing.

* * * * *